(12) United States Patent
Gundersen

(10) Patent No.: US 6,324,484 B1
(45) Date of Patent: Nov. 27, 2001

(54) SELF-TESTABLE SPACECRAFT FOR SELF-TESTING ANALOG FUNCTIONS

(75) Inventor: James L. Gundersen, Laguna Beach, CA (US)

(73) Assignee: Hughes Electronics Corporation, El Segundo, CA (US)

(*) Notice: Subject to any disclaimer, the term of this patent is extended or adjusted under 35 U.S.C. 154(b) by 0 days.

(21) Appl. No.: 09/235,708

(22) Filed: Jan. 22, 1999

(51) Int. Cl.[7] .................................................. G01M 19/00
(52) U.S. Cl. ............................................. 702/115; 706/48
(58) Field of Search ................................... 702/115, 114; 706/46, 47, 48; 713/300, 330; 700/11, 15, 17, 21, 23; 701/31, 34

(56) References Cited

U.S. PATENT DOCUMENTS 4,977,579 * 12/1990 Bateman .................................. 375/10
5,047,700 * 9/1991 Szakaly .............................. 318/568.1
6,157,812 * 12/2000 Sarraf .................................. 455/13.4

* cited by examiner

Primary Examiner—Marc S. Hoff
Assistant Examiner—Edward Raymond
(74) Attorney, Agent, or Firm—Terje Gudmestad

(57) ABSTRACT

A circuit for testing the functionality of an analog circuit of a satellite includes a multiplexer that is coupled to a circuit element to be tested. An analog-to-digital converter is coupled to the multiplexer. A test signal generator is coupled to a controller. The controller is also coupled to the analog-to-digital converter. The controller generates test signals that are coupled to the circuit element. Response signals are generated from the circuit elements and are received by the controller through the multiplexer and analog-to-digital converter. The controller compares the response signals to a predetermined signal indicative of a proper response. An indicator is coupled to the controller to provide an indication of whether or not the circuit elements are functioning properly.

18 Claims, 6 Drawing Sheets

SELF-TESTABLE SPACECRAFT FOR SELF-TESTING ANALOG FUNCTIONS

TECHNICAL FIELD

The present invention relates to space and communications satellites, and more particularly, to testing the operability of electrical components within the satellite.

BACKGROUND ART

Satellites have complex systems with various analog and digital circuits and components that are interconnected through a complex wiring schematic. Commonly, the various systems within a satellite are tested prior to launch.

The functioning and interconnections between the systems are checked on a system operability level. The systems are not necessarily checked during assembly or incorporation into the satellites or their functions with other systems. Also, since satellites have back-up systems, the systems may default to their back-up modes of operation without alerting ground control of an error. The systems may operate for months or years without detection of the activation of the back-up mode.

It is desirable to test the operability of various circuits while the satellite is in orbit and determine their status and functionality. Further, it is desirable to test the operability of the circuits while the satellite is being assembled.

SUMMARY OF THE INVENTION

One object of the invention is to provide a self-testing feature into a spacecraft to provide information regarding the operability of various electrical components within the satellite. It is a further object of the invention to provide a means for providing self-testing after the launch of a satellite.

In one aspect of the invention, a satellite has a test module coupled to a plurality of electrical components. The test module sends test signals to the electrical components. In response to the test signals, the electrical components generate a response signal that is received by the test module. The test module provides an indication of the operability of the electrical components in response to the received response signals.

In a further aspect of the invention, the test module includes a multiplexer that is coupled to the plurality of circuit elements. An analog-to-digital converter is coupled to the multiplexer. A test signal generator is also located within the test module. A controller is coupled to the analog-to-digital converter and to the test signal generators, and generates test signals. The test signals are received by the multiplexer, which routes the test signals through the analog-to-digital converter and back to the controller. The controller provides an indication, through an indicator, as to the functionality of the circuit elements. The indicator may be an audio indicator or a visual indicator such as a LED display or a computer screen display.

One advantage of the invention is that the test module may be implemented onboard a satellite. Thus, during idle time in the operation of the satellite or when a portion or portions of the satellite are idle, the test module may test the functionality of various elements and their interconnection wiring. Another advantage is that many of the components exist in circuitry already on the satellite. Thus, implementation of the invention may be accomplished relatively inexpensively.

Other objects and features of the present invention will become apparent when viewed in light of the detailed description of the preferred embodiment when taken in conjunction with the attached drawings and appended claims.

BEST MODE(S) FOR CARRYING OUT THE INVENTION

Figure 1:
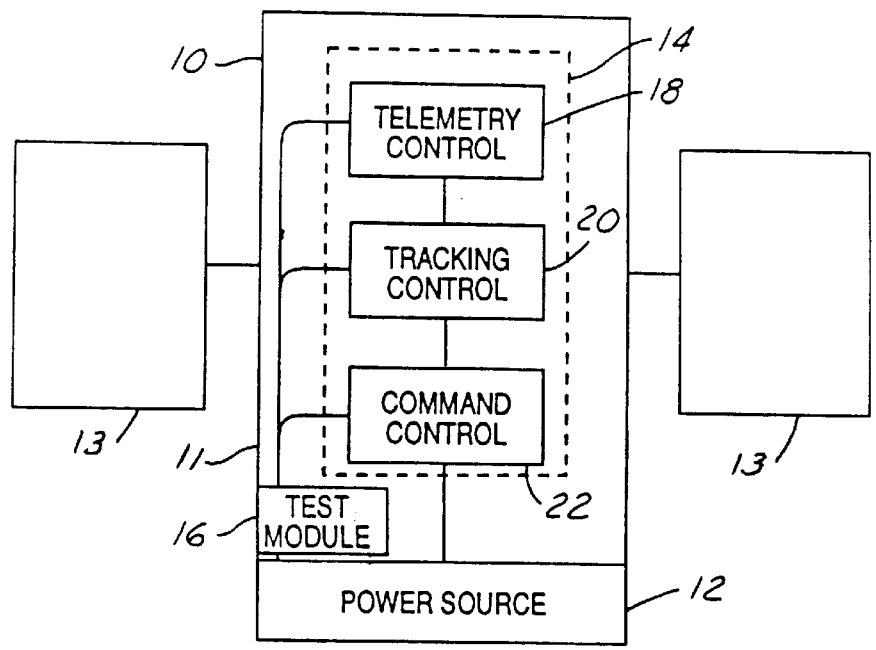
FIG. 1 is schematic view of a satellite having a test module according to the present invention.

Referring now to FIG. 1, a satellite 10 has a body 11 and a pair of solar panels 13. The satellite 10 has a power source 12 which is used to power circuit elements 14 that control various functions on the satellite 10. A test module 16 is coupled to power source 12 and circuit elements 14. Circuit elements 14 may, for example, be a telemetry control module 18, a tracking control module 20, and a communications control module 22. Telemetry control module 18, tracking control module 20, and communications control module 22 are shown for illustrative purposes only. Test module 16 may be coupled to other electrical circuit elements as will be further described below.

Figure 2:
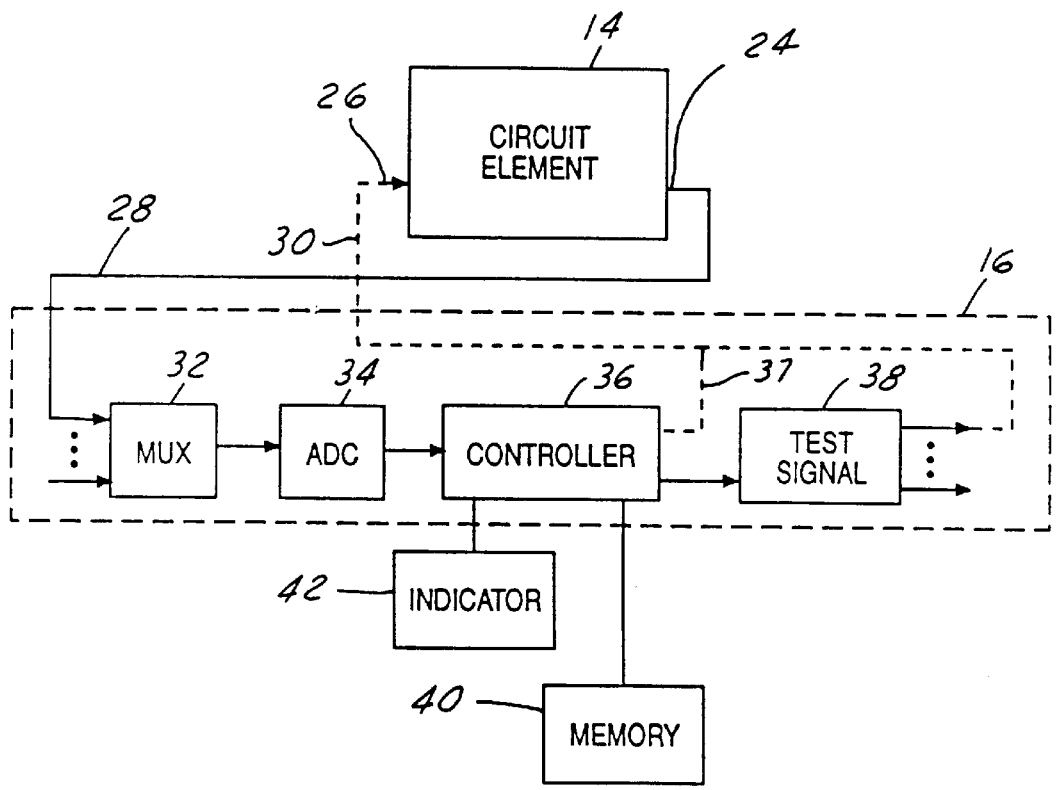
FIG. 2 is a schematic view of a test module coupled to a circuit element.

Referring now to FIG. 2, circuit element 14 has an output 24 and an input 26. Output 24 and input 26 are coupled to test module 16. Output 24 is coupled to an input 28 of test module 16. Input 26 is coupled to an output 30 of test module 16.

Generally, test module 16 generates test signals through output 30 which are received into a circuit element 14 at input 26. In response to the test signals, output 24 generates response signals that are coupled to input 28. In actual practice, a plurality of test signals and a plurality of response signals may be generated and received at the same time.

A multiplexer 32 is coupled to input 28 and receives response signals. Multiplexer 32 is coupled to an analog-to-digital converter 34 which in turn is coupled to a controller 36. Controller 36 may be coupled to a test signal generator 38.

Multiplexer 32 controls the routing of the plurality of response signals to controller 36. Multiplexer thus lets one signal through to analog-to-digital converter 34 at a time. Each of the response signals is an analog signal. Analog-to-digital converter 34 converts the response signals to a digital form which may be further processed by controller 36. Controller 36 is coupled to a memory 40 and an indicator 42.

Memory 40 stores a control program to control the operation of the testing algorithm. To initiate operation, the test program is downloaded to memory 40. Memory 40 may also store variables for comparison to the response signals.

Memory 40 may be included as part of the firmware of the satellite system. By comparing the digitized response signals to signals stored in memory 40, an indication through indicator 42 may be generated by controller 36 as to the functionality of the circuit element 14. Because various response signals may be generated by circuit element 14, the area of circuit element 14 that is not functioning properly may be pinpointed.

Indicator 42 may be an audible response, such as a speaker, or a visual response, such as an indicator light or a computer screen display. A combination of visual and audio may be used.

Test module 16 may be located in satellite 10 or may be located separate from the satellite. The test module 16 may be used or mounted to a test bench in the facility where the satellite 10 is being manufactured. In this manner, the functionality of the satellite circuit elements may be tested individually as the satellite is being assembled and as a system when the satellite is assembled.

Controller 36 may be coupled directly to input 26 of circuit element 14. This is shown by dotted line 37 in FIG. 2. If circuit element 14 is, for example, a stepper motor, controller 36 may be used to control the operation of stepper motor without the generation of test signals. This operation will be further described below.

Figure 3:
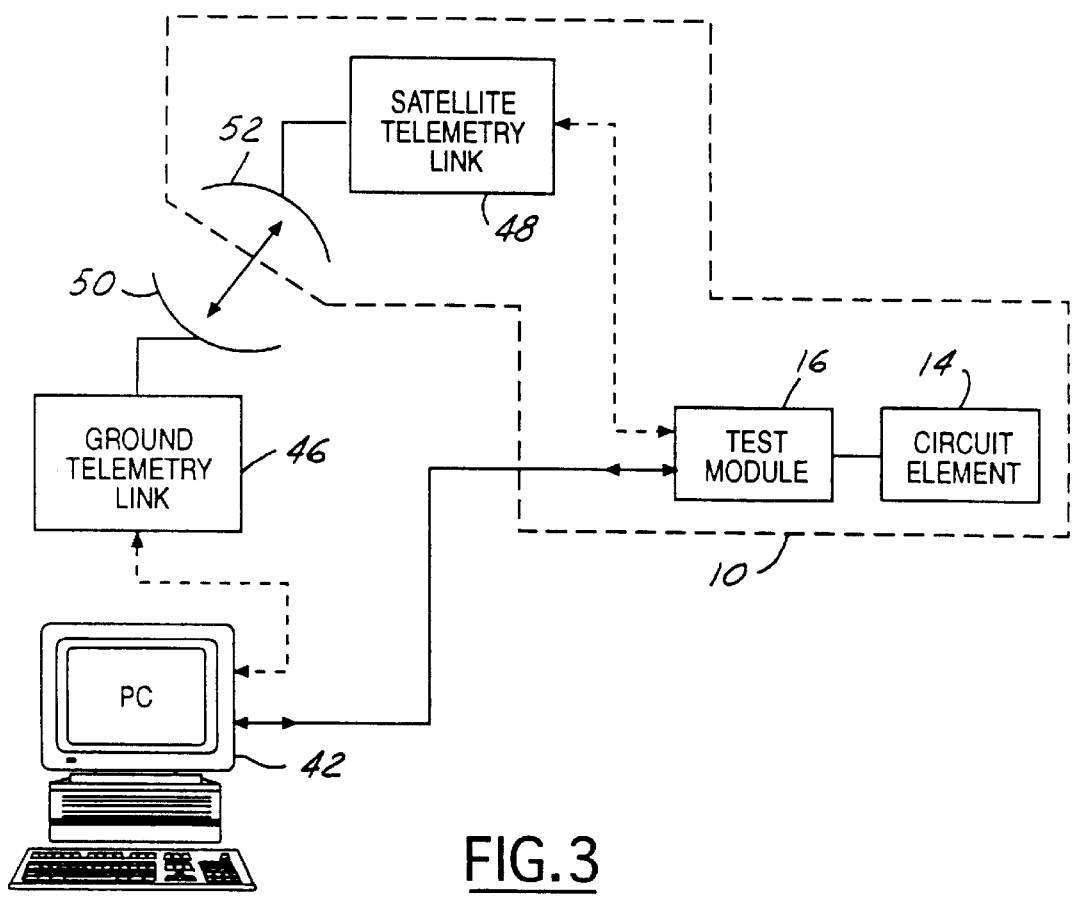
FIG. 3 is a schematic view of a test module used for testing a circuit element of a satellite in orbit.

Referring now to FIG. 3, test module 16 is coupled to a personal computer 42. Computer 42 may be used to program test module 16. Computer 42 may also be used to provide an indication as to the functionality of the circuit element 14.

If test module 16 is located on a satellite 10, and personal computer 42 is located at or near a ground terminal, personal computer 42 may communicate to test module 16 through a ground telemetry link 46 and a satellite telemetry link 48. Communications may be operated in a conventional manner, that is, ground telemetry link may transmit various control signals through an antenna 50. An antenna 52 located on satellite 10 may receive the control signals and transmit the control signals through satellite telemetry link 48. Satellite telemetry link 48 is used to send the control signals from personal computer 42 to test module 16. When test module 16 has performed its test upon circuit element 14, test results may be transmitted back to the personal computer through satellite telemetry link 48 and ground telemetry link 46.

The operation of test module 16 preferably does not interfere with the operation of the normal satellite functions. For ongoing tests, test module 16 may be operated during otherwise idle time on the satellite. In this manner, when the satellite is not communicating with the ground telemetry link 46, various circuit elements 14 may be tested. The test module may perform operational tasks during non-idle times.

One advantage of the system is evident. The test software that is loaded on a satellite may be reconfigured at any time by using computer 42 and uplinking any software changes to test module 16.

Figure 4:
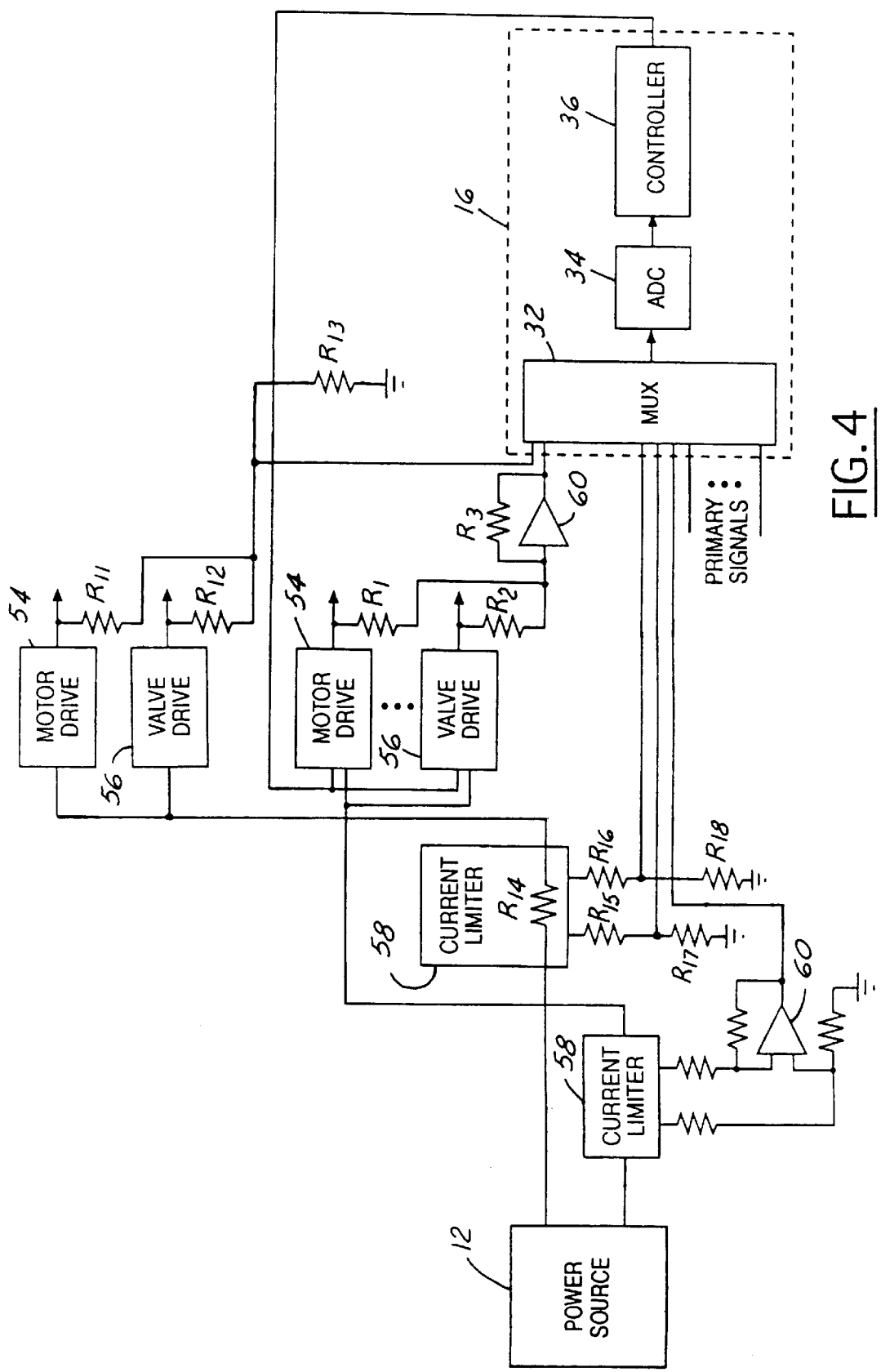
FIG. 4 is a schematic view of a test module coupled to a plurality of electrical components.

Referring now to FIG. 4, test module 16 is shown coupled to motor drives 54, valve drives 56, and two current limiters 58. Current limiters 58 may include a sense resistor $R_{14}$. Only one sense resistor is shown for simplicity. In this configuration, controller 36 may be coupled directly to motor drives 54, valve drives 56, and to the current limiters 58. Resistors $R_1$, $R_2$, $R_{11}$ and $R_{12}$ may be coupled to motor drives 54 and valve drives 56. Thus, the proper motor voltages may be verified by controller 36 activating a motor drive and by having ADC 34 measure the change in voltage at $R_{13}$ through the selected multiplexer input. For improved performance an op amp 60 with a feedback resistor $R_3$ may replace the summing resistor $R_{13}$.

One current limiter 58 is coupled directly to multiplexer 32. The current drawn by the motor may be computed by measuring the change in voltage drop across the sense resistor $R_{14}$ when the motor is driven. The voltage drop across the sense resistor can be calculated by measuring the voltage at $R_{17}$ and $R_{18}$.

The sense resistor of the other current limiter 58 is coupled to an operational amplifier 60. The operational amplifier 60 thus provides a voltage proportional to the load current.

The elements of the test module may be used during non-idle time to perform primary functions. To realize economy in material, this self-testable spacecraft uses the high resolution of an analog-to-digital combined with software and signal processing techniques to extend the measurement resolution.

Figure 5:
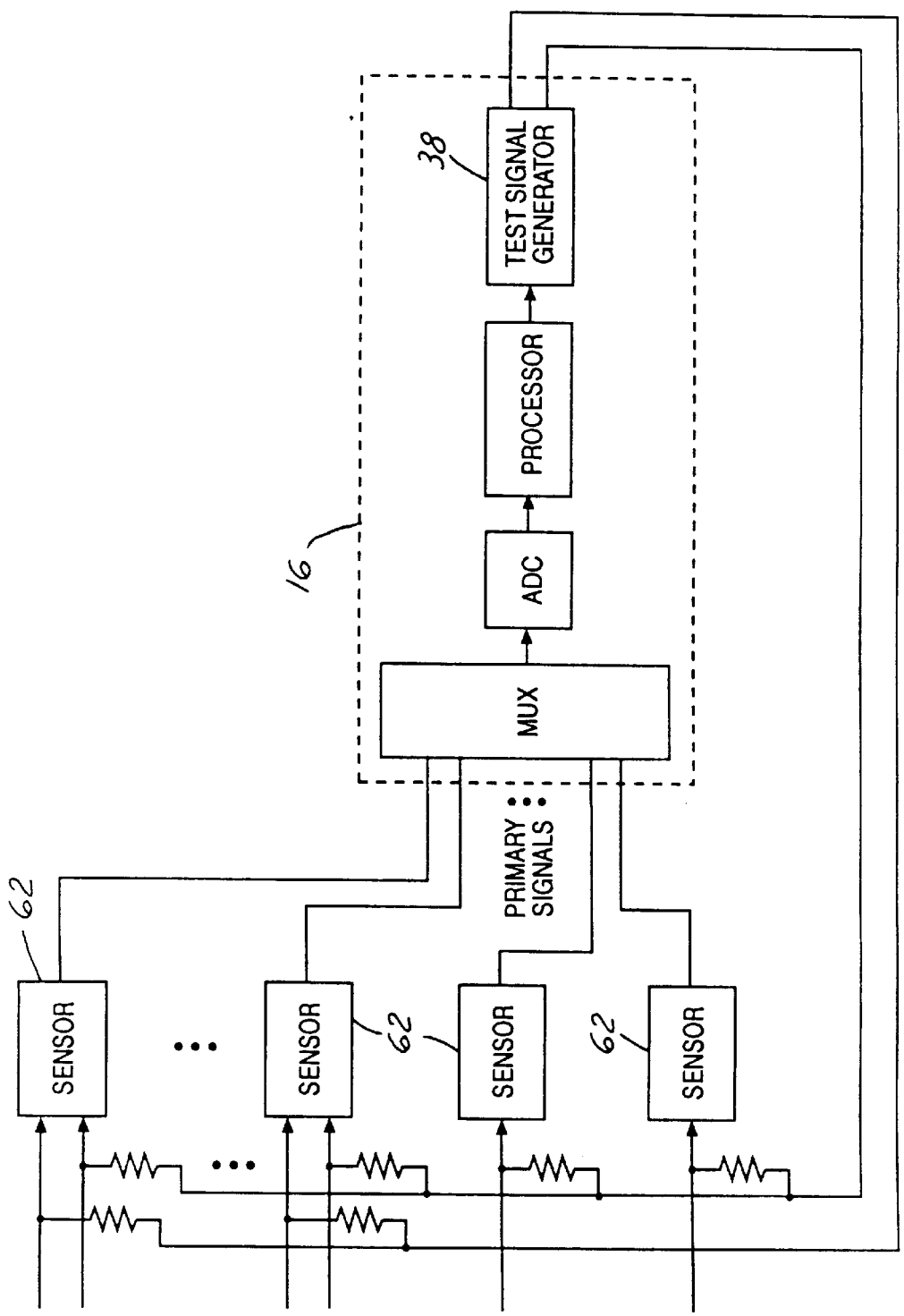
FIG. 5 is a schematic view of a test module coupled to various sensor inputs of a satellite.

Referring now to FIG. 5, test module 16 may be coupled to a plurality of sensors 62. Sensors 62 are coupled to test signal generator 38 of test module 16. In this example, sensors may be a variety of sensors, such as a temperature sensor, a position sensor, pressure sensor, or other sensors associated with the communications in the satellite. In this configuration, a test signal generator 38 is required to provide the proper signal to each of sensors 62. Of course, the proper signal is determined by the type of sensor. The signal supplied to sensors 62 may be of a level that is much smaller than normal by using the high resolution of ADC 34 and processing techniques to recover the smaller signals. The smaller level will allow the test stimulus source to be higher in impedance and in turn minimize the effects on normal operation.

Figure 6:
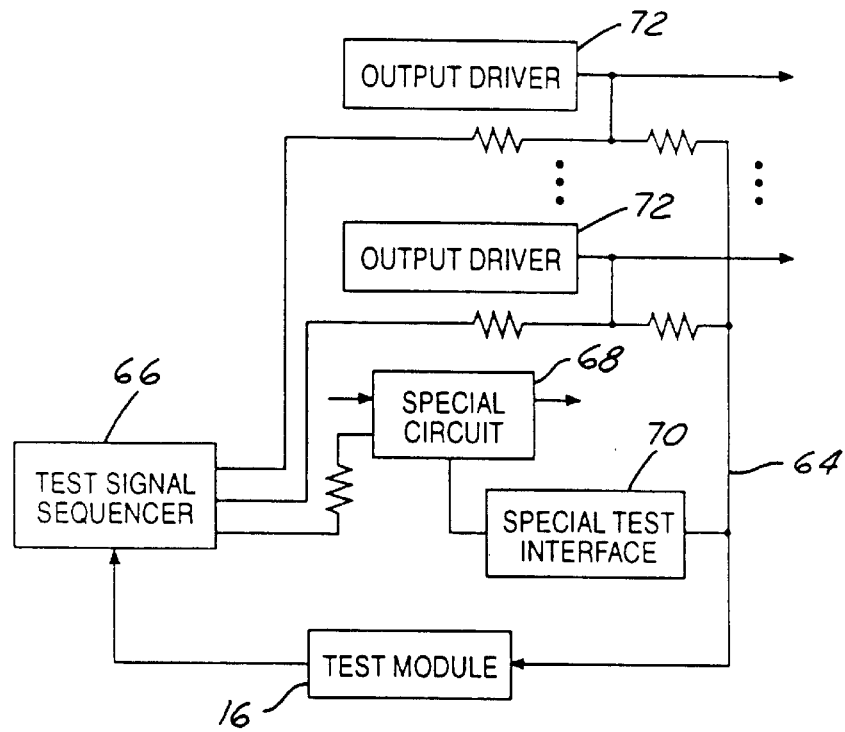
FIG. 6 is a schematic view of a test module coupled to a special circuit.

Referring now to FIG. 6, test module 16 is shown coupled to a remote tester 64. Test module 16 may be a remote unit. In certain situations, test module 16 acts in conjunction with a test signal sequencer 66 within remote tester 64. For example, remote tester 64 may contain a squib and the unit may test for the presence of loads at a low test current. In testing, signal sequencer 66 allows the output of output drivers 72 to be simply summed with a minimum of hardware, e.g., resistors. Then the test signal sequencer, by testing one output at a time, can verify the proper operation of each output.

Test signal sequencer 66 is coupled to a special circuit 68 which is coupled to a special test interface 70. In some instances, for example, in a low current application, a simple test resistor may not allow proper test of the output of a special circuit. A special test interface 70 will be necessary to support an exceptional requirement. Output drivers 72 are also coupled to test signal sequencer 66. As mentioned above, special circuit 68 may be a squib or other low current circuit. For low current applications, a simple test resistor will not properly test the output of special circuit 68.

Another example of the function of a special circuit 68 would be to check the presence of a low level analog clock. Test signal sequencer 66 would thus provide a test signal to special circuit 68 which, in turn, through special test interface 70, provides the information to test module 16.

Figure 7:
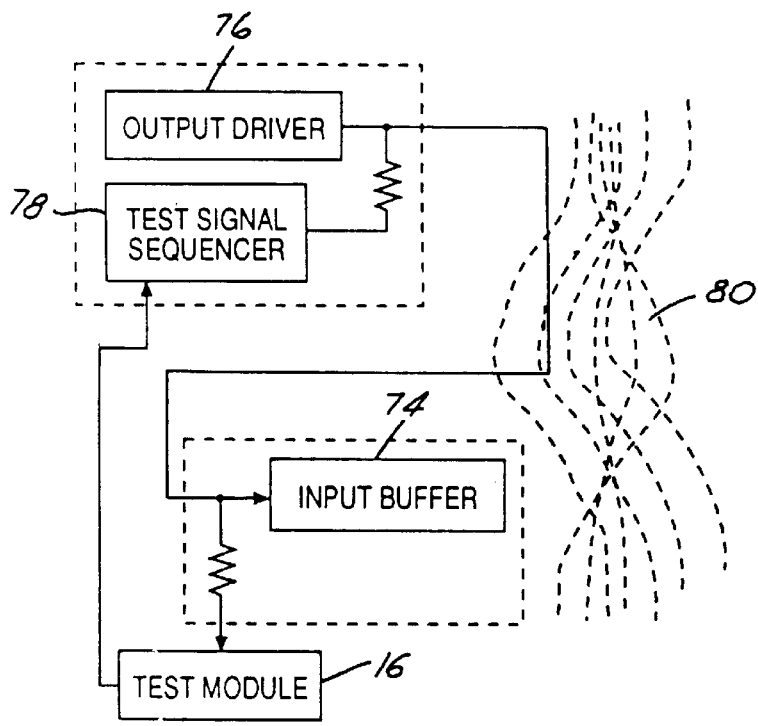
FIG. 7 is a schematic view of a test circuit suitable for testing a series of wire interconnects.

Referring now to FIG. 7, test module 16 is coupled to an input buffer 74, an output driver 76, and a test signal sequencer 78. A wiring bus 80 represents a variety of interconnects between the output driver circuit 76 and input buffer 74. Wiring bus 80 may, for example, be coupled between two microprocessors in the satellite. In a similar manner to that described above, test module 16 may send signals to test sequencer 78 to initiate commands from the microprocessor through wiring bus 80. Input buffer 74 receives the response signals from the wiring bus 80. Test module 16 thus receives the response signals from input buffer 74.

In this current low level AC may be used to test proper wiring continuity for a digital signal path. This may be done without interfering with the voltage thresholds.

Figure 8:
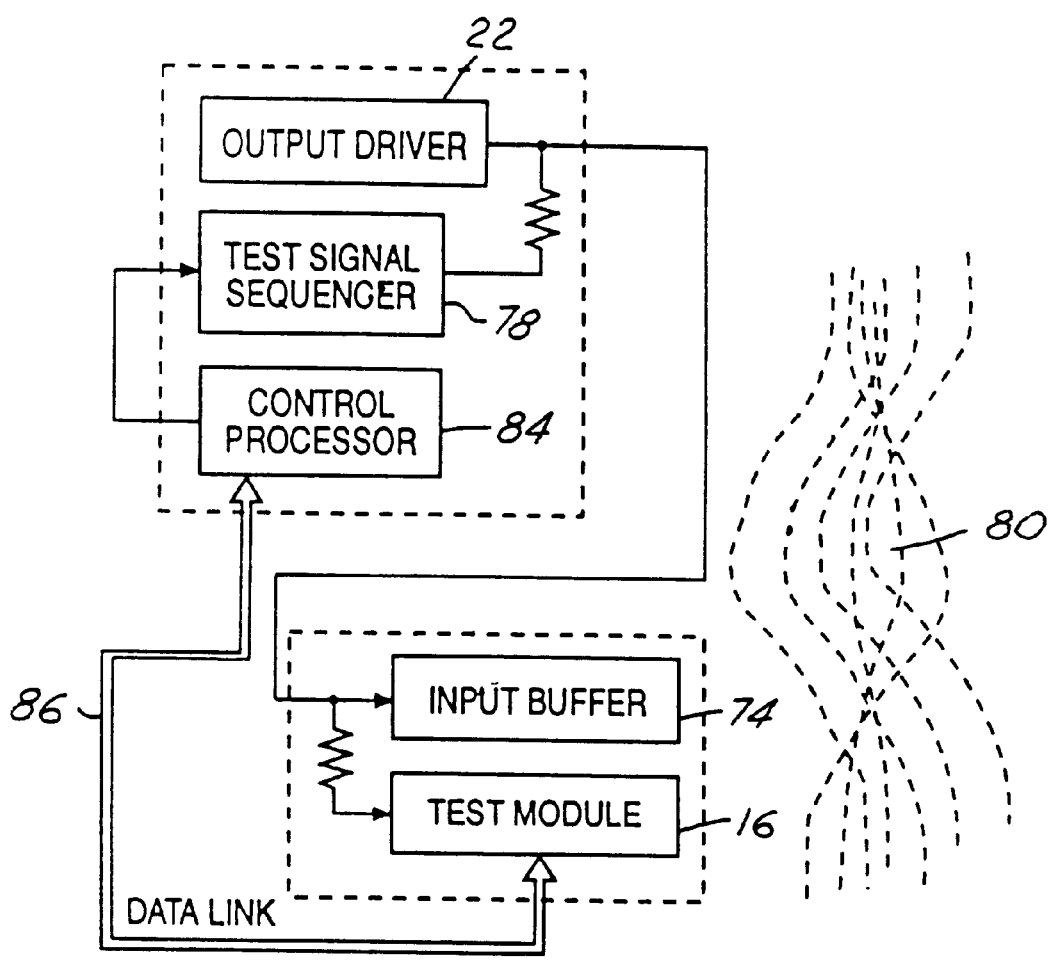
FIG. 8 is a schematic view of a test circuit suitable for testing multiple processors.

Referring now to FIG. 8, test module 16 is coupled to input buffer 74 as above. Also, input buffer 74 is connected to output driver 72 through a wiring bus 80 as above. In this embodiment, a control processor 84 is coupled to test module 16 through a data link 86. Data link 86 coordinates the operation of the controller within test module 16 and control processor 84. Thus, the wiring bus interconnects 80 may be tested in a predetermined manner.

In operation, the test module 16 may be used to test the functioning of various analog functions within the satellite such as missed wiring, including shorts and open circuits, and whether an electrical element is not present. By putting in this minimal hardware, the spacecraft builder and user can create test software at anytime later for different test purposes. With the support of software, test module 16 allows the maximum test flexibility. In this manner, test module 16 may be designed for maximum flexibility. Test module 16 may be used to test various components within the system and interconnects of the system. Several components may be coupled together to provide the multiplexer with a summed analog signal. This testing is meant to provide a general-type testing for the individual circuits. Although this invention deals primarily with analog testing, the teachings of this invention may be combined with the teachings of digital testing to perform complete satellite functionality testing.

While particular embodiments of the invention have been shown and described, numerous variations and alternate embodiments will occur to those skilled in the art. Accordingly, it is intended that the invention be limited only in terms of the appended claims.

What is claimed is:

1. A self testable satellite comprising:
   at least one electrically operable element;
   a test module coupled within the satellite; said test module having,
   a multiplexer coupled to the circuit element, said multiplexer receiving a response signal from said circuit element;
   an analog-to-digital converter coupled to said multiplexer;
   a controller coupled to said analog-to-digital converter, said controller initiating test signals, said controller comparing response signals with a signal indicative of the proper functioning of the circuit element; and
   an indicator coupled to said controller indicating whether the circuit element is functioning properly.

2. A satellite as recited in claim 1 wherein said indicator is an audible source.

3. A satellite as recited in claim 1 further comprising a memory coupled to said controller.

4. A test circuit for testing the functionality of a circuit element for a spacecraft comprising:
   a multiplexer coupled to the circuit element, said multiplexer receiving a response signal from said circuit element;
   an analog-to-digital converter coupled to said multiplexer;
   a controller coupled to said analog-to-digital converter, said controller initiating test signals, said controller comparing response signals with a signal indicative of the proper functioning of the circuit element; and
   an indicator coupled to said controller indicating whether the circuit element is functioning properly.

5. A circuit as recited in claim 4 further comprising a test signal generator coupled to said controller and to said circuit element, said controller indicating the generation of test signals.

6. A circuit as recited in claim 4 wherein the steps of generating comprises generating an audible response.

7. A circuit as recited in claim 4 wherein the circuit element comprises a sensor.

8. A circuit as recited in claim 4 wherein said circuit element comprises a motor drive.

9. A circuit as recited in claim 4 wherein the circuit element comprises a wiring bus.

10. A circuit as recited in claim 4 wherein said indicator is an audible source.

11. A circuit as recited in claim 4 wherein said indicator is a light source.

12. A circuit as recited in claim 4 wherein said indicator is a display.

13. A circuit as recited in claim 4 further comprising a test signal sequencer.

14. A circuit as recited in claim 4 further comprising a wiring bus coupled to an output buffer and said test signal sequencer and an input buffer coupled to said test module.

15. A method for testing a spacecraft comprising the steps of:
   downloading testing software into a memory;
   coupling a wiring harness to an analog circuit;
   generating a test signal;
   receiving an analog response signal in response to test signal;
   selecting the analog response signal through a multiplexer;
   converting the analog response signal to a digital response signal after said step of selecting; and
   generating an indicator in response to said digital response signal.

16. A method as recited in claim 15 wherein the steps of generating comprises generating an audible response.

17. A method as recited in claim 15 wherein the steps of generating comprises generating a visual response.

18. A method as recited in claim 15 further comprising the step of comparing the response signal to a value stored in a memory.

* * * * *